US012750017B2

(12) United States Patent
Chiu et al.

(10) Patent No.: US 12,750,017 B2
(45) Date of Patent: Sep. 29, 2026

(54) CLASS-D AUDIO AMPLIFIER

(71) Applicant: Elite Semiconductor Microelectronics Technology Inc., Hsinchu City (TW)

(72) Inventors: Hsin-Yuan Chiu, Hsinchu City (TW); Che-Wei Hsu, Hsinchu City (TW)

(73) Assignee: Elite Semiconductor Microelectronics Technology Inc., Hsinchu City (TW)

( * ) Notice: Subject to any disclaimer, the term of this patent is extended or adjusted under 35 U.S.C. 154(b) by 453 days.

(21) Appl. No.: 18/412,675

(22) Filed: Jan. 15, 2024

(65) Prior Publication Data

US 2025/0233562 A1 Jul. 17, 2025

(51) Int. Cl.
*H03F 3/217* (2006.01)
*H03K 3/037* (2006.01)

(52) U.S. Cl.
CPC ............ *H03F 3/217* (2013.01); *H03K 3/037* (2013.01); *H03F 2200/03* (2013.01)

(58) Field of Classification Search
CPC .... H03F 3/217; H03F 2200/03; H03F 1/0205; H03F 3/187; H03F 3/45475; H03F 2200/351; H03K 3/037
USPC ........................................ 330/10, 207 A, 251
See application file for complete search history.

(56) References Cited

U.S. PATENT DOCUMENTS

2007/0146069 A1* 6/2007 Wu ........................ H03F 3/2173 330/251
2013/0271214 A1* 10/2013 Van Holland ......... H03F 3/2178 330/251

* cited by examiner

*Primary Examiner* — Hieu P Nguyen
(74) *Attorney, Agent, or Firm* — Cooper Legal Group, LLC

(57) ABSTRACT

A Class-D audio amplifier includes a triangular wave generator, a wave reshaping device and a pulse-width modulator. The triangular wave generator generates a first triangular wave. The wave reshaping device generates a second triangular wave by reshaping the first triangular wave. The pulse-width modulator modulates a pair of differential audio input waves with the second triangular wave instead of the first triangular wave to reduce a switching loss of the Class-D audio amplifier.

12 Claims, 6 Drawing Sheets

CLASS-D AUDIO AMPLIFIER

BACKGROUND OF THE INVENTION

The disclosure relates to a Class-D audio amplifier. More specifically, the disclosure relates to a Class-D audio amplifier with less switching loss.

FIG. 1. shows how a conventional Class-D audio amplifier works. As shown in FIG. 1, the conventional Class-D audio amplifier modulates a pair of differential audio input waves (shown as "$IN^{+}$" and "$IN^{-}$") with a triangular wave by comparing the pair of differential audio input waves with the triangular wave to generate two pulse-width-modulation (PWM) waves (shown as "W1" and "W2") with different widths, and then the conventional Class-D audio amplifier differentiates the two PWM waves via an Exclusive-OR operation to generate a pulse wave (shown as "W3") for output. In doing so, there are two duties in each cycle of the triangular wave, which means that a power stage of the conventional Class-D audio amplifier must be turned on and turned off twice for the two duties in each cycle of the triangular wave. The more times the power stage is turned on and turned off, the more loss (knowns as the switching loss) the conventional Class-D audio amplifier has. In view of this, it is important in the art to reduce the switching loss of the conventional Class-D audio amplifier.

SUMMARY OF THE INVENTION

To overcome at least the aforesaid problem, the present disclosure provides a Class-D audio amplifier. The Class-D audio amplifier may comprise a triangular wave generator, a wave reshaping device and a pulse-width modulator. The wave reshaping device may be electrically connected with the triangular wave generator in a direct or indirect way, and the pulse-width modulator may be electrically connected with the wave reshaping device in a direct or indirect way. The triangular wave generator may be configured to generate a first triangular wave. The wave reshaping device may be configured to generate a second triangular wave by reshaping the first triangular wave, and a slope of the second triangular wave is as same as the first triangular wave. The pulse-width modulator may be configured to alternately or simultaneously modulate a pair of differential audio input waves with the second triangular wave instead of the first triangular wave to reduce a switching loss of the Class-D audio amplifier. In the proposed Class-D audio amplifier, a beginning of each cycle of the second triangular wave is when an amplitude of the first triangular wave becomes equal to an amplitude of a negative audio input wave of the pair of differential audio input waves, and a top of each cycle of the second triangular wave is when an amplitude of the second triangular wave becomes equal to an amplitude of a positive audio input wave of the pair of differential audio input waves or where the first triangular wave begins to go down.

To overcome at least the aforesaid problem, the present disclosure also provides a modulation method for a Class-D audio amplifier. The modulation method may comprise steps of: generating, by a triangular wave generator, a first triangular wave; generating, by a wave reshaping device, a second triangular wave by reshaping the first triangular wave, wherein a slope of the second triangular wave is as same as the first triangular wave; and modulating, by a pulse-width modulator, a pair of differential audio input waves with the second triangular wave instead of the first triangular wave to reduce a switching loss of the Class-D audio amplifier. In the proposed modulation method, a beginning of each cycle of the second triangular wave is when an amplitude of the first triangular wave becomes equal to an amplitude of a negative audio input wave of the pair of differential audio input waves, and a top of each cycle of the second triangular wave is when an amplitude of the second triangular wave becomes equal to an amplitude of a positive audio input wave of the pair of differential audio input waves or where the first triangular wave begins to go down.

Different from that the conventional Class-D audio amplifier modulates the pair of differential audio input waves with the first triangular wave (i.e., the general triangular wave), which causes two duties in each cycle of the first triangular wave, the proposed Class-D audio amplifier modulates the pair of differential audio input waves with the second triangular wave (i.e., a reshaped triangular wave) instead of the first triangular wave, which can achieve one single duty, as a integration of the two duties, in each cycle of the second triangular wave, thereby reducing a switching loss of the Class-D audio amplifier.

The summary is not intended to limit the claimed invention, but merely provides basic profile of the claimed invention. The details of the claimed invention will be described with various embodiments as presented below.

DETAILED DESCRIPTION OF THE INVENTION

The embodiments as disclosed below are not intended to limit the claimed invention to any specific environment, applications, structures, processes or situations. In the attached drawings, elements which are not directly related to the claimed invention are omitted from depiction. Dimensions and dimensional relationships among individual elements in the attached drawings are only exemplary examples and are not intended to limit the claimed invention. Unless stated particularly, same element numerals may correspond to same elements in the following description without inconsistency with the claimed invention.

The terminology used herein is for the purpose of describing the embodiments only and is not intended to limit the claimed invention. The singular forms "a" and "an" are intended to include the plural forms as well, unless the context clearly indicates otherwise. The terms "comprises," "comprising," "includes," "including," etc., specify the presence of the stated features, integers, operations, elements, and/or components, but do not preclude the presence or addition of one or more other features, integers, operations, elements, components, and/or groups thereof. The term "and/or" includes any and all combinations of one or more of the associated listed items. Although the terms "first", "second" and "third" etc., may be used herein to describe various elements, these elements should not be limited by these terms. These terms are merely used to distinguish one element from another element. Thus, for example, a first element described below could also be termed a second element, without departing from the spirit and scope of the claimed invention.

Figure 1:
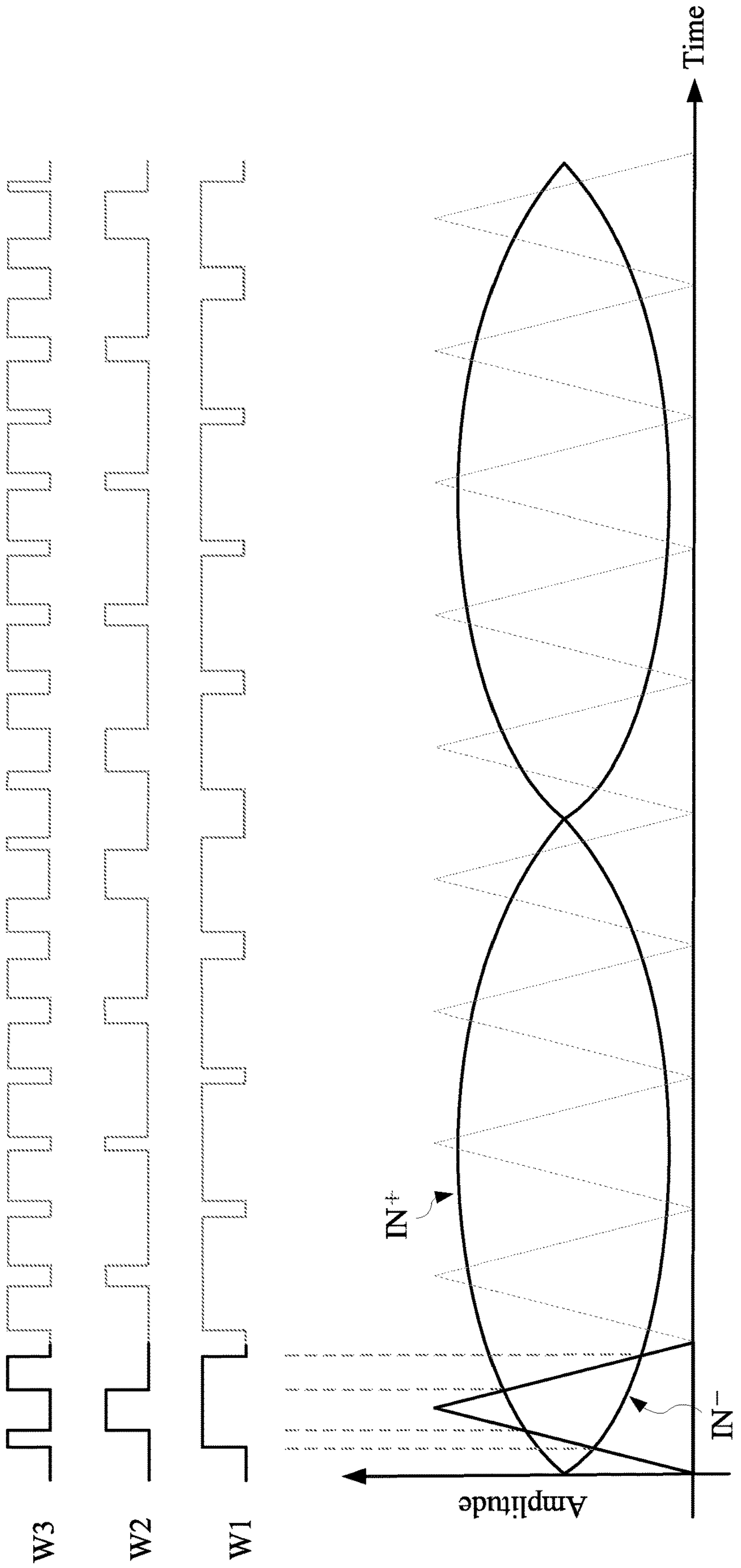
FIG. 1 (Prior Art)
FIG. 1 provides a waveform diagram for showing how a conventional Class-D audio amplifier works.
Figure 2A:
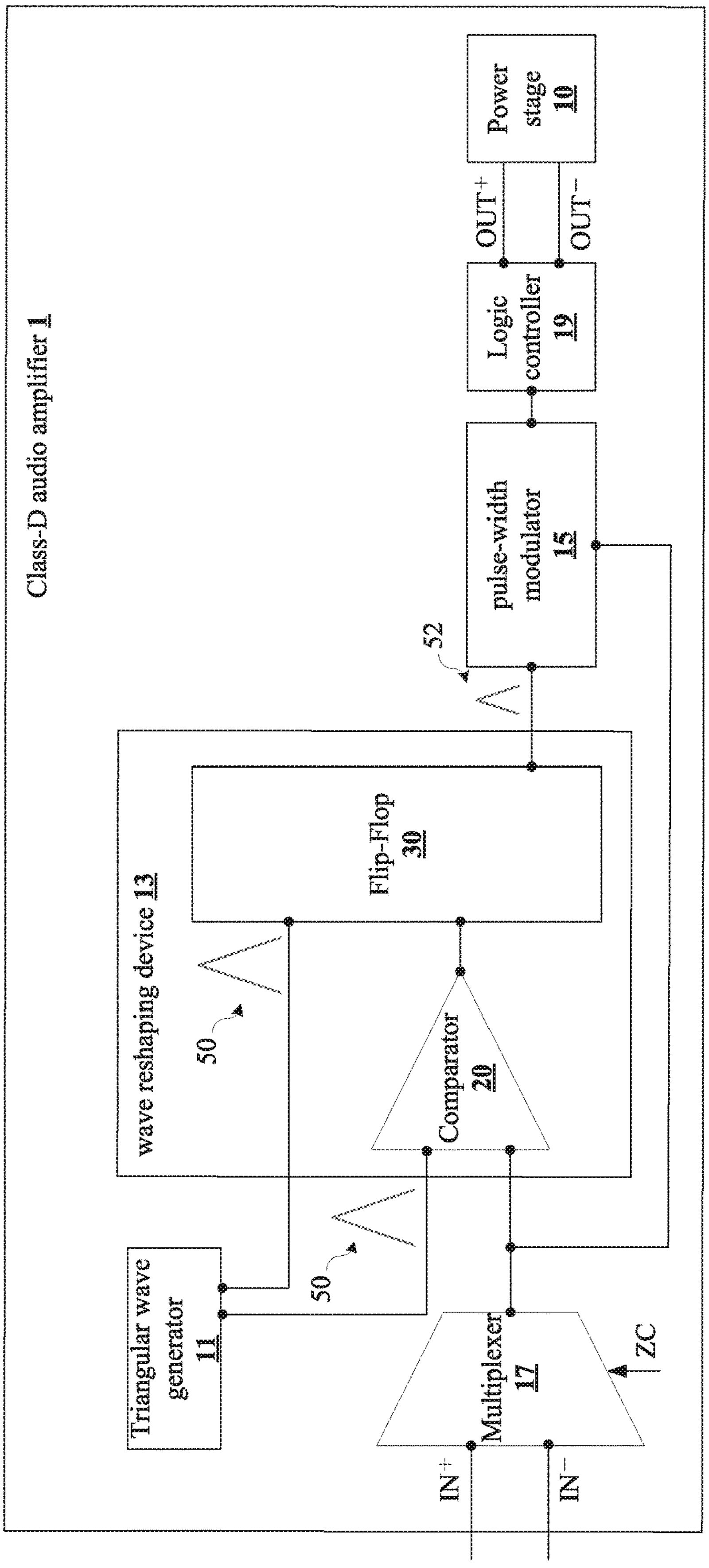
FIG. 2A illustrates a schematic view of a Class-D audio amplifier according to some embodiments of the present disclosure.
Figure 2B:
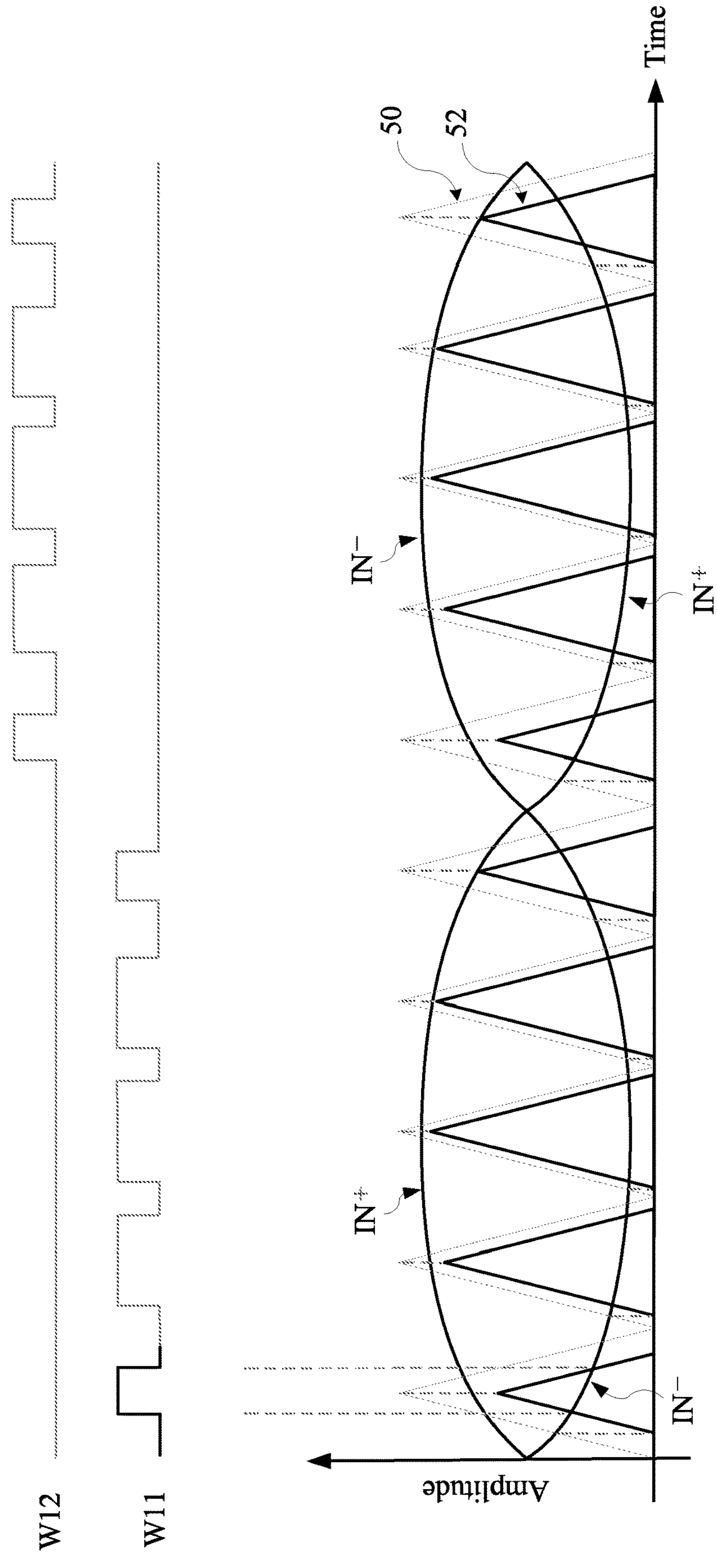
FIG. 2B provides a waveform diagram for showing how the proposed Class-D audio amplifier of FIG. 2A generates a PWM wave.

FIG. 2A illustrates a schematic view of a Class-D audio amplifier according to some embodiments of the present disclosure. FIG. 2B provides a waveform diagram for showing how the proposed Class-D audio amplifier of FIG. 2A generates a PWM wave. The contents shown in FIG. 2A and FIG. 2B are provided only for illustrating embodiments of the present disclosure and should not be construed as any limitations on the claimed invention.

Referring to FIG. 2A, there is a proposed Class-D audio amplifier 1. The Class-D audio amplifier 1 may basically comprise, for example, a triangular wave generator 11, a wave reshaping device 13, a pulse-width modulator 15 and a power stage 10. In some embodiments, the Class-D audio amplifier 1 may additionally comprise a multiplexer 17 and a logic controller 19 to alternately input and output a pair of differential waves. The triangular wave generator 11, the wave reshaping device 13, the pulse-width modulator 15, the multiplexer 17, the logic controller 19 and the power stage 10 may be electrically connected to each other directly or indirectly. The power stage 10 may be configured to output pulse waves to drive a speaker (not shown).

The multiplexer 17 may comprise two input terminals and one output terminal, and the two input terminals are configured to receive a pair of differential audio input waves including a positive audio input wave $IN^+$ and a negative audio input wave $IN^-$. In addition, the output terminal of the multiplexer 17 is configured to alternately output either the negative audio input wave $IN^-$ or the positive audio input wave $IN^+$, depending on a zero-crossing signal ZC. The zero-crossing signal ZC is used to switch the voltage polarity, such as transitioning from a positive value to a negative value or from a negative value to a positive value. For example, the multiplexer 17 may be configured to output the negative audio input wave $IN^-$ of the pair of differential audio input waves during the former half-cycle, and output the positive audio input wave of the pair of differential audio input waves during the latter half-cycle.

The triangular wave generator 11 may be implemented as any of various known triangular wave generators, and configured to generate a first triangular wave 50.

The wave reshaping device 13 may be configured to generate a second triangular wave 52 by reshaping the first triangular wave 50, and a slope of the second triangular wave 52 is as same as the first triangular wave 50. For example, the wave reshaping device 13 may comprise a comparator 20 and a flip-flop 30. As shown in FIG. 2A, the comparator 20 is electrically connected with the triangular wave generator 11, the multiplexer 17 and the flip-flop 30, while the flip-flop 30 is electrically connected with the triangular wave generator 11, the comparator 20, and the pulse-width modulator 15.

Referring to FIGS. 2A-2B, the comparator 20 may be configured to compare an amplitude of the first triangular wave 50 generated by the triangular wave generator 11 and an amplitude of the negative audio input wave $IN^-$ or the positive audio input wave $IN^+$ of the pair of differential audio input waves. For example, when the multiplexer 17 outputs the negative audio input wave $IN^-$ of the pair of differential audio input waves into the comparator 20 during the former half-cycle, the comparator 20 will compare the amplitude of the first triangular wave 50 with the amplitude of the negative audio input wave $IN^-$. Similarly, when the multiplexer 17 outputs the positive audio input wave $IN^+$ of the pair of differential audio input waves into the comparator 20 during the latter half-cycle, the comparator 20 will compare the amplitude of the first triangular wave 50 with the amplitude of the positive audio input wave $IN^+$.

Referring to FIGS. 2A-2B, the flip-flop 30 may be any of various known flip-flops (e.g., a SR flip-flop), and configured to determine a beginning of each cycle of the second triangular wave 52 based on an output of the comparator 20 and determine the top of each cycle of the second triangular wave 52 based on when the first triangular wave 50 begins to go down. In other words, under the control of the flip-flop 30, the beginning of each cycle of the second triangular wave 52 is when the amplitude of the first triangular wave 50 becomes equal to the amplitude of the negative audio input wave $IN^-$ of the pair of differential audio input waves, and the top of each cycle of the second triangular wave 52 is when the first triangular wave 50 begins to go down.

Referring to FIGS. 2A-2B, the pulse-width modulator 15 may be configured to modulate the pair of differential audio input waves with the second triangular wave 52 instead of the first triangular wave 50 to reduce a switching loss of the Class-D audio amplifier 1. For example, the pulse-width modulator 15 may comprises a comparator (not shown), and the comparator may alternately compare the second triangular wave 52 with the negative audio input wave $IN^-$ and the positive audio input wave $IN^+$ of the pair of differential audio input waves to generate respective pulse waves.

Referring to FIGS. 2A-2B, the logic controller 19 may be configured to alternately output a pair of pulse waves including a first pulse wave $OUT^+$ and a second pulse wave $OUT^-$ into the power stage 10 to drive a speaker (not shown). In the case where the multiplexer 17 outputs the negative audio input wave $IN^-$ into the comparator 20, the logic controller 19 outputs the second pulse wave $OUT^+$ into the power stage 10. In the case where the multiplexer 17 outputs the positive audio input wave $IN^+$ into the comparator 20, the logic controller 19 outputs the first pulse wave $OUT^-$ into the power stage 10.

As shown in FIG. 2B, there is a pair of pulse waves. The pulse wave W11 is generated by comparing the negative audio input wave $IN^-$ with the second triangular wave 52 via the pulse-width modulator 15, while the pulse wave W12 is generated by comparing the positive audio input wave $IN^+$ with the second triangular wave 52 via the pulse-width modulator 15. Within the former half-cycle of each cycle of the pair of the pair of differential audio input waves, the pulse wave W11 presents a series of pulses with different width, but the pulse wave W12 shows no pulses. On the contrary, within the latter half-cycle of each cycle of the pair of the pair of differential audio input waves, the pulse wave W12 presents a series of pulses with different width, but the pulse wave W11 shows no pulses. Therefore, differentiating the pulse wave W11 and the pulse wave W12 will still generate a pulse wave with only one duty in each cycle of the second triangular wave 52, and thus the Class-D audio amplifier 1 has less switching loss as compared with the conventional Class-D audio amplifier.

Figure 3A:
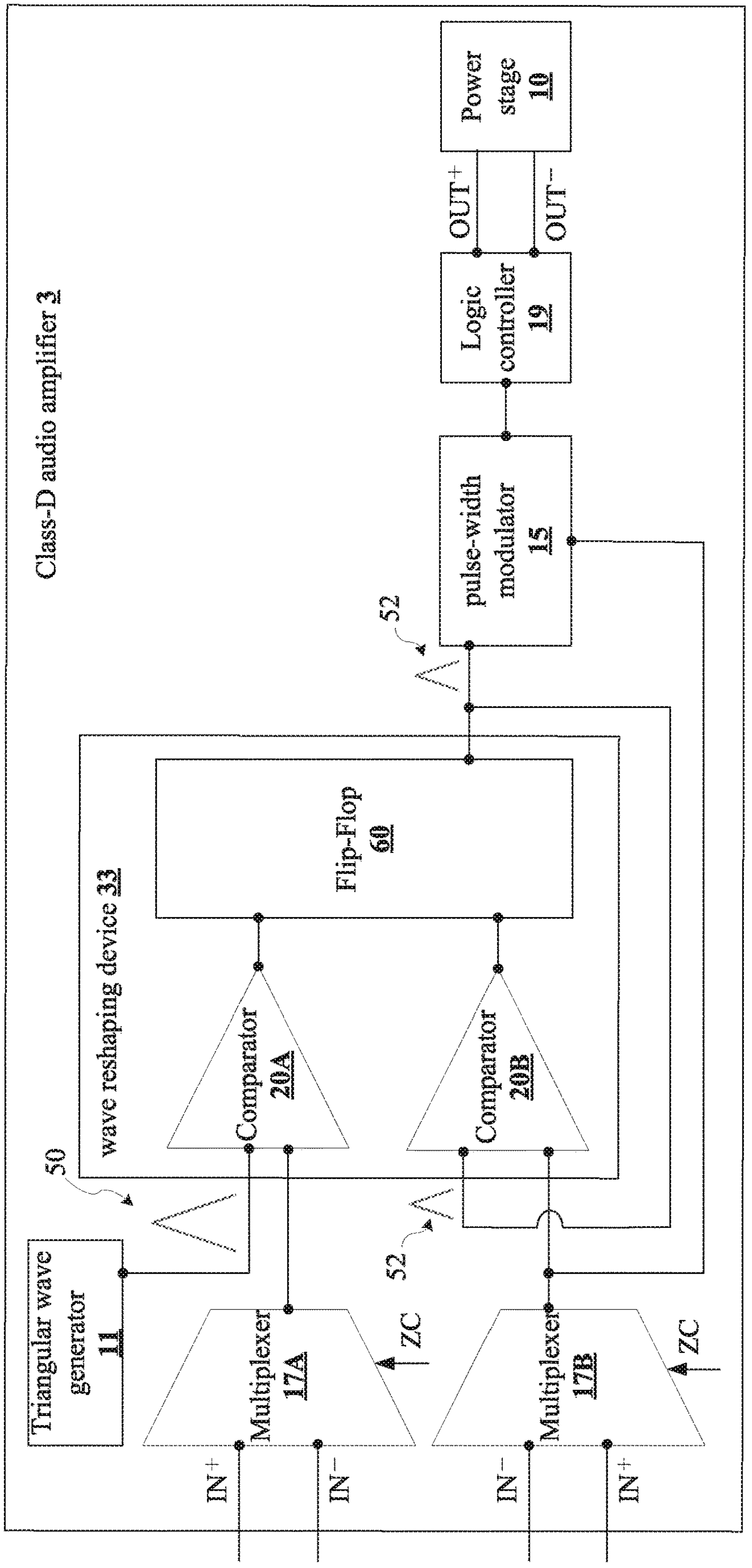
FIG. 3A illustrates a schematic view of a Class-D audio amplifier according to some other embodiments of the present disclosure.
Figure 3B:
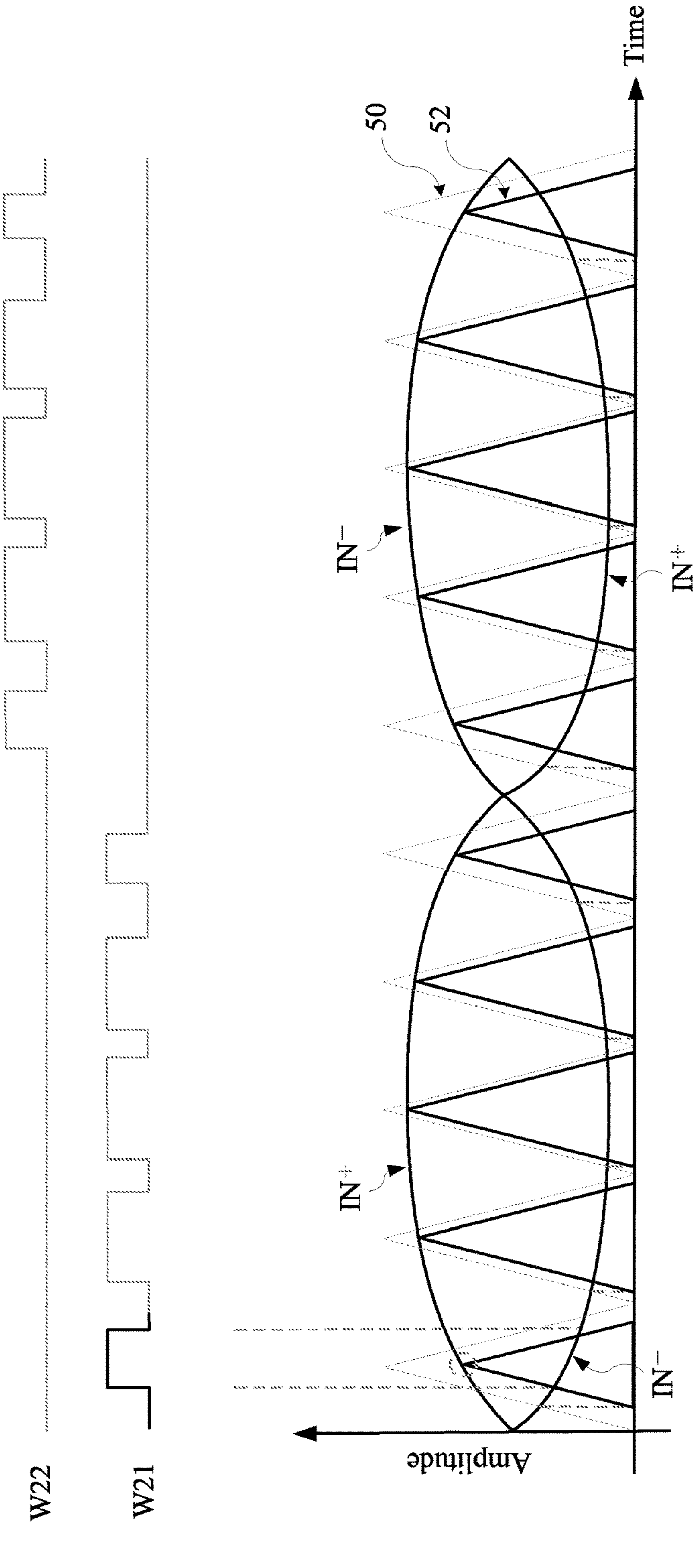
FIG. 3B provides a waveform diagram for showing how the proposed Class-D audio amplifier of FIG. 3A generates a PWM wave.

FIG. 3A illustrates a schematic view of a Class-D audio amplifier according to some other embodiments of the present disclosure, while FIG. 3B provides a waveform diagram for showing how the proposed Class-D audio amplifier of FIG. 3A generates a PWM wave. The contents shown in FIG. 3A and FIG. 3B are only provided for illustrating embodiments of the present disclosure and should not be construed as any limitations on the claimed invention.

Referring to FIG. 3A, there is another proposed Class-D audio amplifier 3. The differences between the Class-D audio amplifier 1 and the Class-D audio amplifier 3 comprise that the Class-D audio amplifier 3 comprises two multiplexers (shown as a first multiplexer 17A and a second multiplexer 17B) instead on only one multiplexer (i.e., the multiplexer 17) and that the wave reshaping device 33 of the Class-D audio amplifier 3 comprises two comparators (shown as a first comparator 20A and a second comparator 20B) instead of only one comparator (i.e., the comparator 20 of the wave reshaping device 13). The first multiplexer 17A and the first comparator 20A of the Class-D audio amplifier 3 function as the multiplexer 17 and the comparator 20 of the Class-D audio amplifier 1 respectively. In addition, the triangular wave generator 11, the pulse-width modulator 15 and the power stage 10 of the Class-D audio amplifier 3 are the same as those of the Class-D audio amplifier 1.

Same as the first multiplexer 17A, the second multiplexer 17B may comprise two input terminals and one output terminal, and the two input terminals are configured to receive a pair of differential audio input waves including a positive audio input wave $IN^+$ and a negative audio input wave $IN^-$. In addition, the output terminal of the second multiplexer 17B is configured to alternately output either the negative audio input wave $IN^-$ or the positive audio input wave $IN^+$, depending on a zero-crossing signal ZC. The difference between the first multiplexer 17A and the second multiplexer 17B is that they output the pair of differential audio input waves in a opposite way. That is, the second multiplexer 17B will output the positive audio input wave $IN^+$ when the first multiplexer 17A outputs the negative audio input wave $IN^-$, and vice versa.

Different from the first comparator 20A, the second comparator 20B is configured to compare the amplitude of the second triangular wave 52 with the pair of differential audio input waves.

Same as the flip-flop 30, the flip-flop 60 may be any of various known flip-flops (e.g., a SR flip-flop), and configured to determine a beginning of each cycle of the second triangular wave 52 based on an output of the first comparator 20A. However, different from the flip-flop 30, the flip-flop 60 is configured to determine the top of each cycle of the second triangular wave 52 based on an output of the second comparator 20B. In other words, under the control of the flip-flop 60, the beginning of each cycle of the second triangular wave 52 is when the amplitude of the first triangular wave 50 becomes equal to the amplitude of the negative audio input wave $IN^-$ of the pair of differential audio input waves, and the top of each cycle of the second triangular wave 52 is when the amplitude of the second triangular wave 52 becomes equal to the amplitude of the positive audio input wave $IN^+$ of the pair of differential audio input waves.

As shown in FIG. 3B, there is a pair of pulse waves. The pulse wave W21 is generated by comparing the negative audio input wave $IN^-$ with the second triangular wave 52 via the pulse-width modulator 15, while the pulse wave W22 is generated by comparing the positive audio input wave $IN^+$ with the second triangular wave 52 via the pulse-width modulator 15. Within the former half-cycle of each cycle of the pair of the pair of differential audio input waves, the pulse wave W21 presents a series of pulses with different width, but the pulse wave W22 shows no pulses. On the contrary, within the latter half-cycle of each cycle of the pair of the pair of differential audio input waves, the pulse wave W22 presents a series of pulses with different width, but the pulse wave W21 shows no pulses. Therefore, differentiating the pulse wave W21 and the pulse wave W22 will still generate a pulse wave with only one duty in each cycle of the second triangular wave 52, and thus the Class-D audio amplifier 3 has less switching loss as compared with the conventional Class-D audio amplifier.

Figure 4:
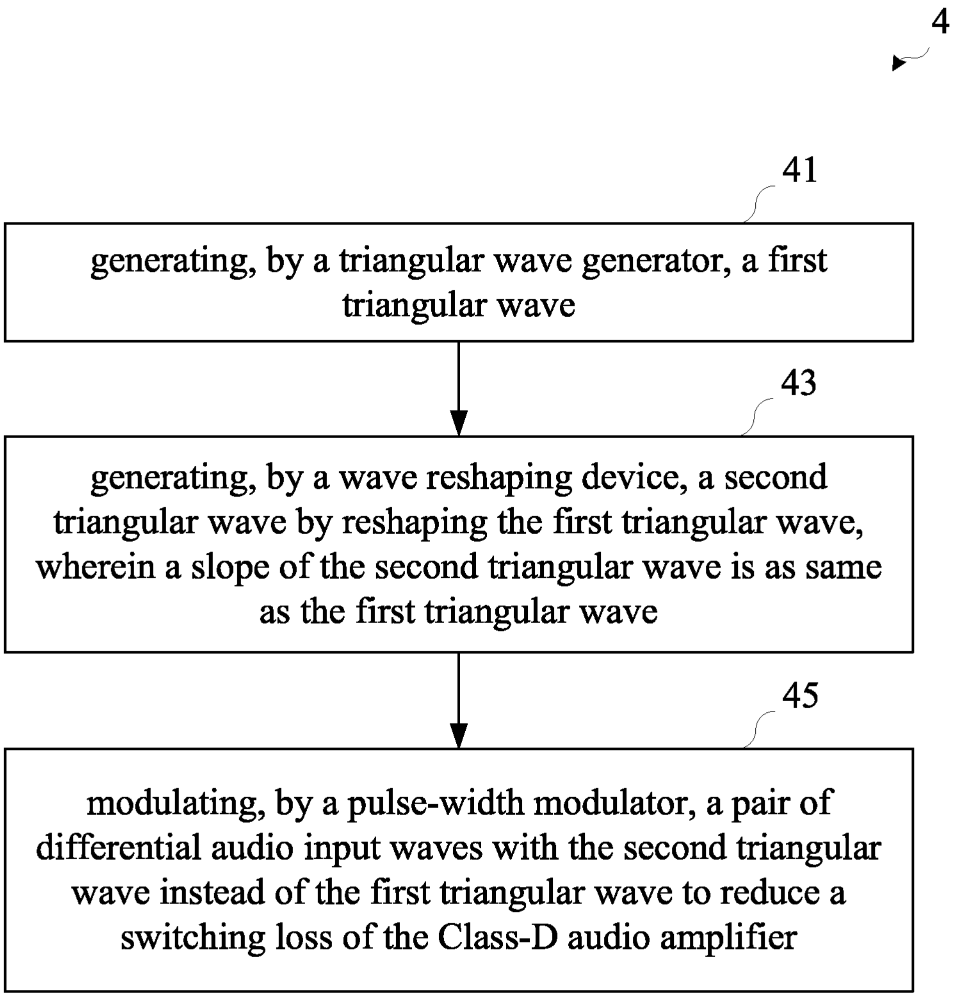
FIG. 4 illustrates a flowchart for describing a modulation method for a Class-D audio amplifier according to some embodiments of the present disclosure.

FIG. 4 illustrates a flowchart for describing a modulation method for a Class-D audio amplifier according to some embodiments of the present disclosure, which is provided only for the descriptions of various embodiments and should not be regarded as any limitations to the claimed invention.

Referring to FIG. 4, there is a modulation method 4 for a Class-D audio amplifier. The modulation method 4 may comprise steps of: generating, by a triangular wave generator, a first triangular wave (marked with "41"); generating, by a wave reshaping device, a second triangular wave by reshaping the first triangular wave, wherein a slope of the second triangular wave is as same as the first triangular wave (marked with "43"); and modulating, by a pulse-width modulator, a pair of differential audio input waves with the second triangular wave instead of the first triangular wave to reduce a switching loss of the Class-D audio amplifier (marked with "45"). In addition, in the modulation method 4, a beginning of each cycle of the second triangular wave is when an amplitude of the first triangular wave becomes equal to an amplitude of a negative audio input wave of the pair of differential audio input waves, and a top of each cycle of the second triangular wave is when an amplitude of the second triangular wave becomes equal to an amplitude of a positive audio input wave of the pair of differential audio input waves or where the first triangular wave begins to go down.

In some embodiments, the modulation method 4 may further comprises steps of: comparing, by a comparator, the amplitude of the first triangular wave and the amplitude of the negative audio input wave of the pair of differential audio input waves to generate a comparison result; determining, by a flip-flop, a beginning of each cycle of the second triangular wave based on the comparison result; and determining, by the flip-flop, the top of each cycle of the second triangular wave based on when the first triangular wave begins to go down.

In some embodiments, the modulation method 4 may further comprises steps of: comparing, by a first comparator, the amplitude of the first triangular wave and the amplitude of the negative audio input wave of the pair of differential audio input waves to generate a first comparison result; determining, by a flip-flop, a beginning of each cycle of the second triangular wave based on the first comparison result; comparing, by a second comparator, the amplitude of the second triangular wave and the amplitude of the positive audio input wave of the pair of differential audio input waves to generate a second comparison result; and determining, by the flip-flop, the top of each cycle of the second triangular wave based on the second comparison result.

In some embodiments, the modulation method 4 may further comprises a step of: alternately inputting, by at least one multiplexer, the positive audio input wave and the negative audio input wave of the pair of differential audio input waves into the wave reshaping device.

In some embodiments, the modulation method 4 may further comprises a step of: alternately outputting, by a logic controller, a pair of pulse waves.

In some embodiments of the modulation method 4, modulating the pair of differential audio input waves with the second triangular wave comprises comparing the pair of differential audio input waves with the second triangular wave by a comparator.

Each embodiment of the modulation method 4 basically corresponds to a certain embodiment of the Class-D audio amplifier 1 or the Class-D audio amplifier 3. Therefore, those of ordinary skill in the art can fully understand and implement all the corresponding embodiments of the modulation method 4 simply by referring to the above descriptions for the Class-D audio amplifier 1 and the Class-D audio amplifier 3, even though not all the embodiments of the modulation method 4 are described in detail above.

Without inconsistency with the claimed invention, a variety of combinations, modifications and/or replacements of the directly or indirectly disclosed embodiments are substantially comprised in the whole disclosure, even though they are not especially mentioned above. The scopes of the claimed invention are defined by the following claims as appended.

The invention claimed is:

1. A Class-D audio amplifier, comprising:

a triangular wave generator, being configured to generating a first triangular wave;

a wave reshaping device electrically connected with the triangular wave generator, being configured to generate a second triangular wave by reshaping the first triangular wave, wherein a slope of the second triangular wave is as same as the first triangular wave; and a pulse-width modulator electrically connected with the wave reshaping device, being configured to modulate a pair of differential audio input waves with the second triangular wave instead of the first triangular wave to reduce a switching loss of the Class-D audio amplifier;

wherein a beginning of each cycle of the second triangular wave is when an amplitude of the first triangular wave becomes equal to an amplitude of a negative audio input wave of the pair of differential audio input waves, and a top of each cycle of the second triangular wave is when an amplitude of the second triangular wave becomes equal to an amplitude of a positive audio input wave of the pair of differential audio input waves or where the first triangular wave begins to go down.

2. The Class-D audio amplifier of claim 1, wherein the wave reshaping device comprises:

a comparator, being configured to compare the amplitude of the first triangular wave and the amplitude of the negative audio input wave of the pair of differential audio input waves; and a flip-flop, being configured to:

determine the beginning of each cycle of the second triangular wave based on an output of the comparator; and determine the top of each cycle of the second triangular wave based on when the first triangular wave begins to go down.

3. The Class-D audio amplifier of claim 1, wherein the wave reshaping device comprises:

a first comparator, being configured to compare the amplitude of the first triangular wave and the amplitude of the negative audio input wave of the pair of differential audio input waves;

a second comparator, being configured to compare the amplitude of the second triangular wave and the amplitude of the positive audio input wave of the pair of differential audio input waves; and a flip-flop, being configured to:

determine the beginning of each cycle of the second triangular wave based on an output of the first comparator; and determine the top of each cycle of the second triangular wave based on an output of the second comparator.

4. The Class-D audio amplifier of claim 1, further comprising:

at least one multiplexer, being configured to alternately input the positive audio input wave and the negative audio input wave of the pair of differential audio input waves into the wave reshaping device.

5. The Class-D audio amplifier of claim 1, further comprising:

a logic controller, being configured to alternately output a pair of pulse waves.

6. The Class-D audio amplifier of claim 1, wherein the pulse-width modulator comprises a comparator being configured to compare the pair of differential audio input waves with the second triangular wave.

7. A modulation method for a Class-D audio amplifier, comprising:

generating, by a triangular wave generator, a first triangular wave;

generating, by a wave reshaping device, a second triangular wave by reshaping the first triangular wave, wherein a slope of the second triangular wave is as same as the first triangular wave; and modulating, by a pulse-width modulator, a pair of differential audio input waves with the second triangular wave instead of the first triangular wave to reduce a switching loss of the Class-D audio amplifier;

wherein a beginning of each cycle of the second triangular wave is when an amplitude of the first triangular wave becomes equal to an amplitude of a negative audio input wave of the pair of differential audio input waves, and a top of each cycle of the second triangular wave is when an amplitude of the second triangular wave becomes equal to an amplitude of a positive audio input wave of the pair of differential audio input waves or where the first triangular wave begins to go down.

8. The modulation method of claim 7, further comprising comparing, by a comparator, the amplitude of the first triangular wave and the amplitude of the negative audio input wave of the pair of differential audio input waves to generate a comparison result;

determining, by a flip-flop, the beginning of each cycle of the second triangular wave based on the comparison result; and determining, by the flip-flop, the top of each cycle of the second triangular wave based on when the first triangular wave begins to go down.

9. The modulation method of claim 7, further comprising:

comparing, by a first comparator, the amplitude of the first triangular wave and the amplitude of the negative audio input wave of the pair of differential audio input waves to generate a first comparison result;

determining, by a flip-flop, the beginning of each cycle of the second triangular wave based on the first comparison result;

comparing, by a second comparator, the amplitude of the second triangular wave and the amplitude of the positive audio input wave of the pair of differential audio input waves to generate a second comparison result; and determining, by the flip-flop, the top of each cycle of the second triangular wave based on the second comparison result.

10. The modulation method of claim 7, further comprising:

alternately inputting, by at least one multiplexer, the positive audio input wave and the negative audio input wave of the pair of differential audio input waves into the wave reshaping device.

11. The modulation method of claim 7, further comprising:

alternately outputting, by a logic controller, a pair of pulse waves.

12. The modulation method of claim 7, wherein modulating the pair of differential audio input waves with the second triangular wave comprises comparing the pair of differential audio input waves with the second triangular wave by a comparator.

* * * * *